United States Patent

Hoffmeyer et al.

[11] Patent Number: 6,076,726
[45] Date of Patent: Jun. 20, 2000

[54] PAD-ON-VIA ASSEMBLY TECHNIQUE

[75] Inventors: Mark Kenneth Hoffmeyer; Phillip Duane Isaacs, both of Rochester, Minn.

[73] Assignee: International Business Machines Corporation, Armonk, N.Y.

[21] Appl. No.: 09/108,482

[22] Filed: Jul. 1, 1998

[51] Int. Cl.⁷ .................................................. B23K 31/02
[52] U.S. Cl. .............................. 228/180.22; 228/180.2; 228/180.22; 228/56.3; 257/776
[58] Field of Search ................................ 228/180.22, 35, 228/262, 245, 256, 258; 29/839, 840; 252/514

[56] References Cited

U.S. PATENT DOCUMENTS

| | | | |
|---|---|---|---|
| 4,610,758 | 9/1986 | Wilson | 156/656 |
| 5,147,084 | 9/1992 | Behun et al. | 228/56.3 |
| 5,262,718 | 11/1993 | Svendsen et al. | 324/158 |
| 5,275,330 | 1/1994 | Isaacs et al. | 228/180.2 |
| 5,372,295 | 12/1994 | Abe et al. | 228/123.1 |
| 5,422,190 | 6/1995 | Alexander | 428/552 |
| 5,429,293 | 7/1995 | Bradley, III et al. | 228/180.22 |
| 5,591,941 | 1/1997 | Acocella et al. | 174/266 |
| 5,615,477 | 4/1997 | Sweitzer | 29/840 |
| 5,665,459 | 9/1997 | Fukuta et al. | 428/209 |
| 5,698,015 | 12/1997 | Mohri et al. | 106/1.13 |
| 5,718,367 | 2/1998 | Covell, II et al. | 228/254 |
| 5,734,560 | 3/1998 | Kamperman et al. | 361/774 |
| 5,758,412 | 6/1998 | Knopp | 29/852 |
| 5,803,344 | 9/1998 | Stankavich et al. | 228/180.22 |
| 5,838,069 | 11/1998 | Itai et al. | 257/766 |
| 5,887,345 | 3/1999 | Kulesza et al. | 29/852 |
| 5,902,686 | 5/1999 | Mis | 428/629 |
| 5,922,245 | 7/1999 | Mohri et al. | 252/512 |
| 5,928,404 | 7/1999 | Paruchuri et al. | 75/12 |

*Primary Examiner*—Patrick Ryan
*Assistant Examiner*—Lynne Edmondson
*Attorney, Agent, or Firm*—Robert W. Lahtinen; Matthew J. Bussan

[57] ABSTRACT

Fine pitch area array packaging is achieved using a via-in-pad design within the area array attach portion of a printed circuit board (PCB). The limitation of the design is the wicking action, whereby solder applied to the capture pad contact surface is depleted by capillary action into the via hole when reflowed, causing insufficient solder to be present at the contact surface to effect reliable and repeatable electrical connections. In one implementation, an initial application of solder is applied to plug the via hole with a material having a higher final melting temperature than eutectic solder, thereby providing a stable plug. This plug is formed by the initial solder application that may be either a eutectic solder containing a third metal that forms intermetallic compounds, when reflowed, that elevate the liquidus temperature or a solder having a different formulation with an inherent higher melting temperature. An alternative implementation is to plate the via hole with a material, such as nickel, which prevents eutectic solder, applied to the via capture pad contact surface, from wetting the hole surface and being drawn away from the contact surface by capillary action. Thus, the solder, applied to the via capture pad and used to establish an electrical connection is not depleted.

7 Claims, 12 Drawing Sheets

PAD-ON-VIA ASSEMBLY TECHNIQUE

FIELD OF THE INVENTION

This invention relates to the soldering of an electronic module to a plated through via in a substrate such as a printed circuit card.

BACKGROUND OF THE INVENTION

Component or module packages using a column grid array (CGA), ball grid array (BGA) or chip scale package (CSP) may use various module processing technologies to achieve higher lead pin densities, that range from 0.050 in. (1.27 mm) pitch to less than 0.025 in. (0.63 mm) pitch. However, for connection of area array modules having array pitches of less than 1 mm, circuit board fabrication is both difficult and expensive. Fabrication restrictions arise because minimum plated through hole (PTH) sizes, internal plane registrations, and minimum line and space needs to support wiring densities that enable module interconnect and wiring redistribution exceed technological process limits of conventional printed circuit board (PCB) manufacture. Although several methods exist which enable generation of boards that support high density module interconnects including additive plating methods, plasma and/or laser via fabrication methods, and use of high density patch interconnects, most processing and packaging techniques are either still very expensive, are currently in exploratory stages of development, or do not support high volume production requirements.

Printed circuit boards are commonly fabricated using plated through via holes that extend through the board and which are plated to present a via capture pad surrounding the opening at least one end and a coating on the via hole cylindrical surface which communicates with the opposite side of the board. The via capture pad surrounding the via termination affords a "via-in-pad" design. The via hole plating also contacts the land surfaces on intermediate layer surfaces that are meant to communicate with the contact associated with the via.

To optimize the density of module interconnections, it is necessary to effect connection between the terminals of a module and the printed circuit board plated via capture pads that surround the via openings. Such a connection requires the formation of multiple reliable solder connections at the ends of the aligned via openings. The solder applied to the confronting end of the plated flange at the via opening tends to flow into the via passageway when heat is applied to effect module connection. The solder that remains at the connection site is then less than required to effect a reliable electrical connection.

The problem of reliable pad-on-via solder connections of modules to printed circuit boards has been addressed by prior art processes. A method for resolving the problem is to sequentially apply solder paste and reflow the material until the via hole is prefilled and wicking of solder away from the attachment site during solder reflow has ceased. Such a method is illustrated by the teaching of U.S. Pat. No. 5,275,330 issued to Isaacs et al, where the via passage is filled with solder prior to the solder ball pad-on-via connection of an electronic module. By using this card design and assembly process approach, the lead density can be increased from 0.050 in. to an effective pitch of 0.025 in. or less. Since this is an area measurement, this improvement constitutes a four times increase in local wiring density using common PCB fabrication technology. Although the process of the patent can be successfully used for assembly, multiple pass solder plugging steps are required and the process may encounter less than acceptable assembly yield for high volume production. Yield detractors are primarily caused by surface tension variability of the solder within discrete vias coupled with remelting events during component attach. In some vias, solder does not remain in place to provide an adequate solder plug and joint inconsistencies such as opens and insufficient solder joint fillet formations may result after assembly.

SUMMARY OF THE INVENTION

The technique of the present invention enables reliable and repeatable solder connections between module connector surfaces and the via capture pad surfaces of circuit board plated through via openings. In a first embodiment, a eutectic lead-tin solder paste containing additional metal particles is applied to the via capture pad surfaces. The additional metal particles are selected from a group of metals that form one or more intermetallic phases in the solder mixture which elevate the liquidus temperature. Suitable materials for these additive particles are palladium and silver. When the solder is heated and reflowed at the melting temperature of eutectic solder, the intermetallic phase or phases within the solder are formed. As the melting range and liquidus temperature of the solder increases, the reflow of solder into the via terminates causing the via opening at the pad to be plugged, and module attachment can thereafter be effected by eutectic Sn/Pb solder paste applied and reflowed at normal soldering temperatures.

In a second embodiment, the cylindrical plated layer or barrel portion of the via, extending through the printed circuit card, is plated with nickel or another metal that is not wetted sufficiently by the reflowing of lead-tin eutectic solder using fluxes which allow good wetting to copper. The solder paste may then be applied to the fluxed, copper plated capture pad of the plated through via and thereafter reflowed to effect module attachment without depletion of the solder into the via passageway by capillary action.

DETAILED DESCRIPTION

Figure 1:
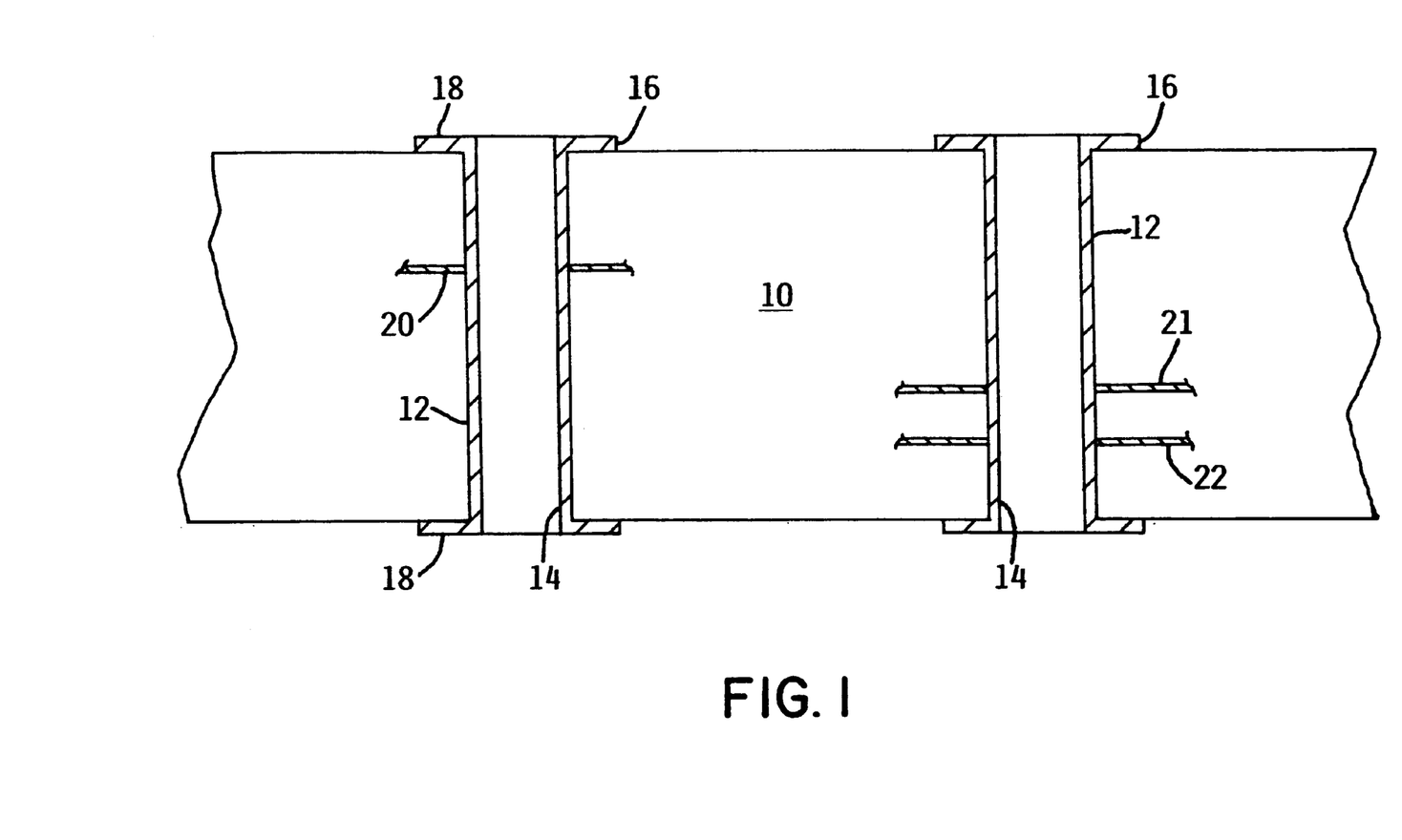
FIG. 1 is a section view of a PCB with typical plated through vias including a cylindrical plated or barrel portion that may connect with lands or conductors on intermediate layer surfaces and terminates at one or both ends in a plated capture pad that forms the contact surface of a via-in-pad design.

A solution for PCB fabrication enabling fine pitch area array package interconnect support is provided using a "via-in-pad" design within the area array attach portion of the board design. FIG. 1 illustrates a typical multilayer printed circuit board (PCB) 10 with a pair of via holes 12 extending through the card. The via holes 12 are copper plated to form a cylindrical plated surface or barrel 14 along the wall surfaces that define the hole 12 through the printed circuit board 10 with the plating terminating at each surface in via capture pads 16 that provide an extended contact pad surface 18 for effecting electrical connection with a module or other electrical apparatus or conductor. Connection to conductors resident on intermediate layer surfaces within the PC board are effected by conductor lands 20, 21, 22 which contact the via copper plated cylindrical surface layer 14 within the via passageway. Thus, the design incorporates redistribution vias into actual pads 16 intended for solder interconnect of all module column or ball input/outputs. The "via-in-pad" card design creates space for added surface wiring channels, thereby allowing for greater wiring densities and finer pad pitches to be achieved using standard PCB fabrication methods. In order to successfully implement "via-in-pad" board attach designs, modification to board fabrication, assembly process, and/or resultant packaging structures must be provided to ensure that consistent and reliable solder joint interconnects will be generated during module attach to the PCB.

Figure 2:
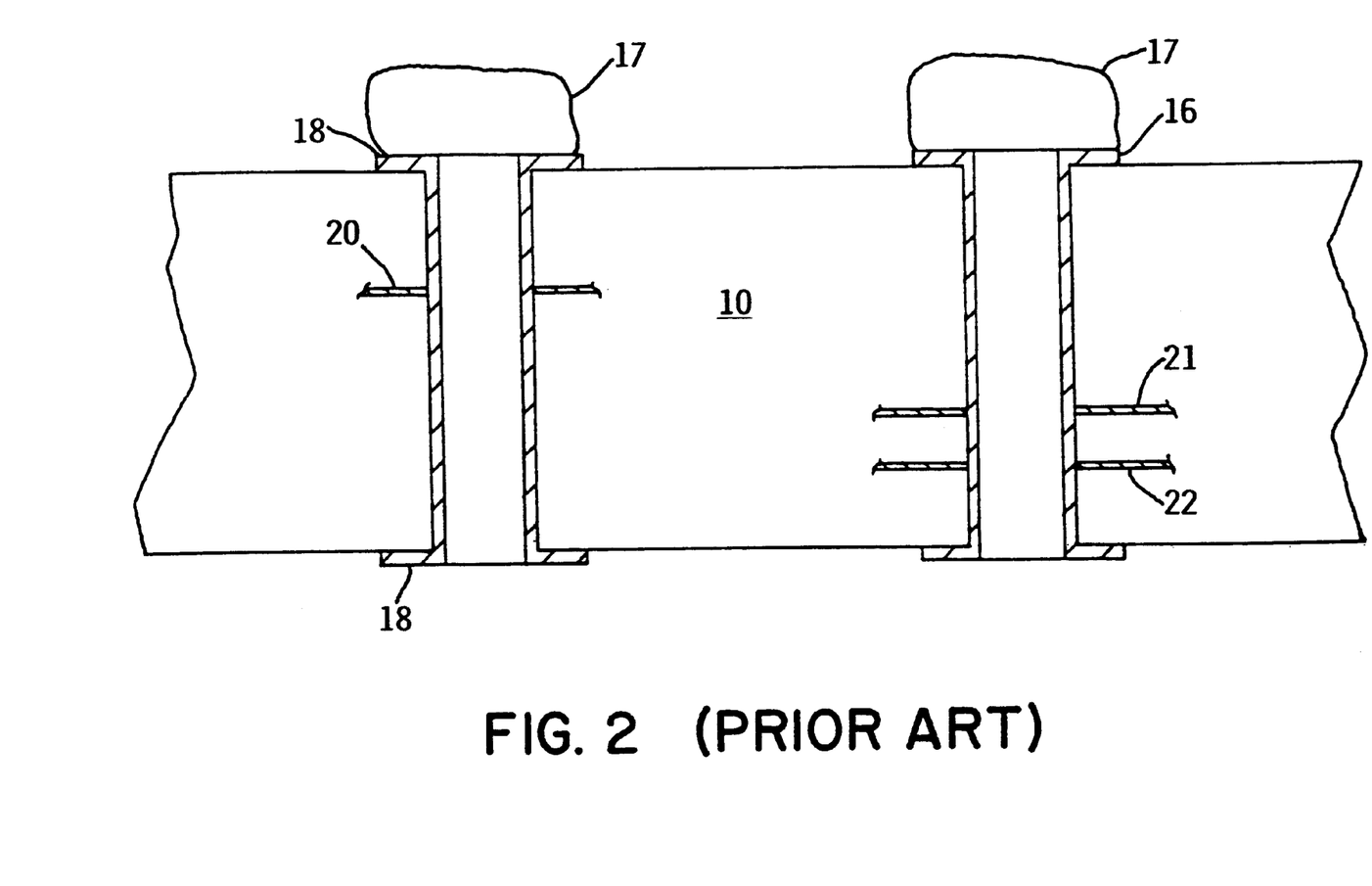
FIG. 2 illustrates the PCB of FIG. 1 wherein eutectic solder paste has been applied to the via capture pad contact surfaces.
Figure 3:
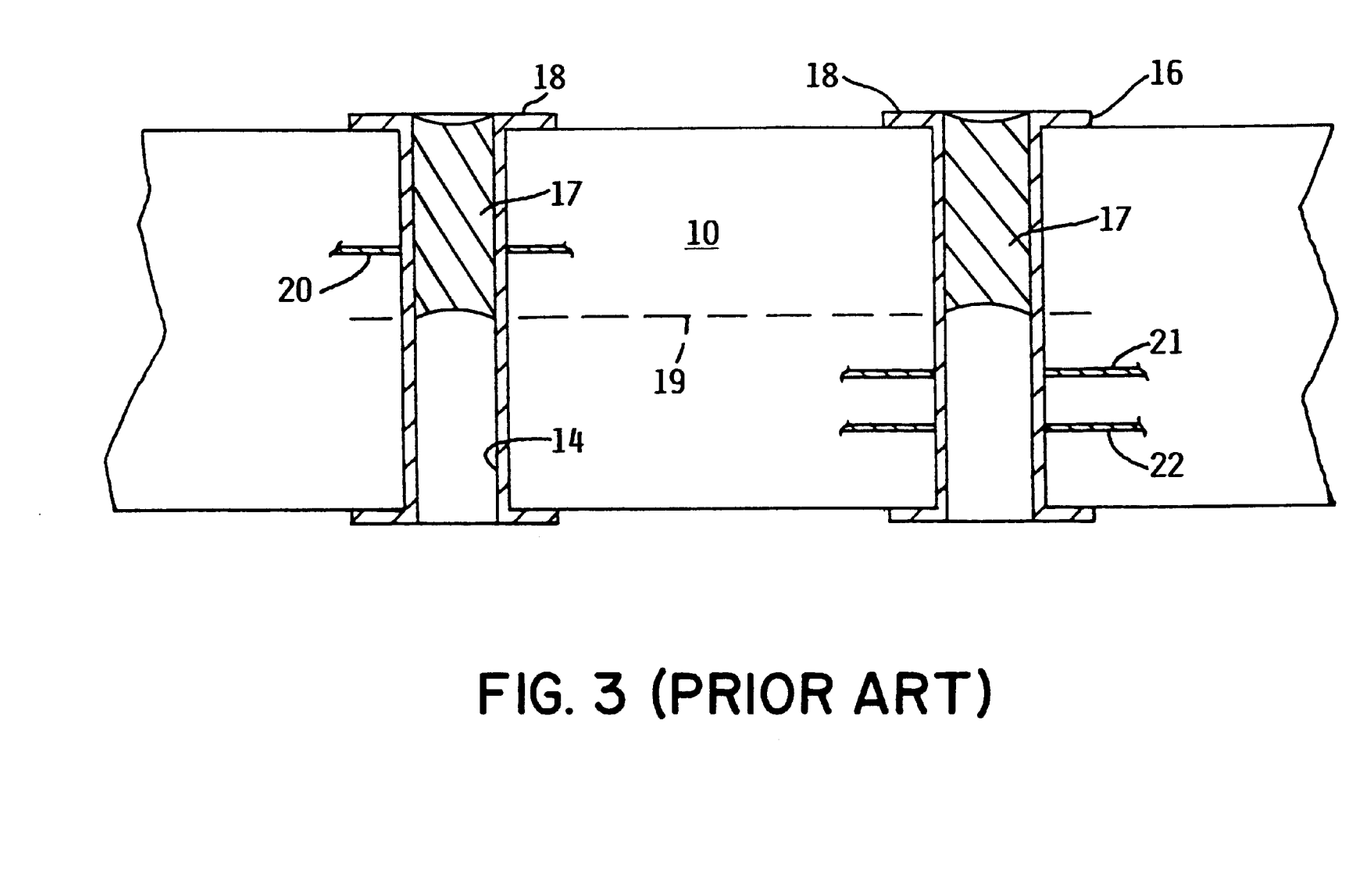
FIG. 3 shows the PCB of FIG. 2 following reflow of the solder paste.
Figure 4:
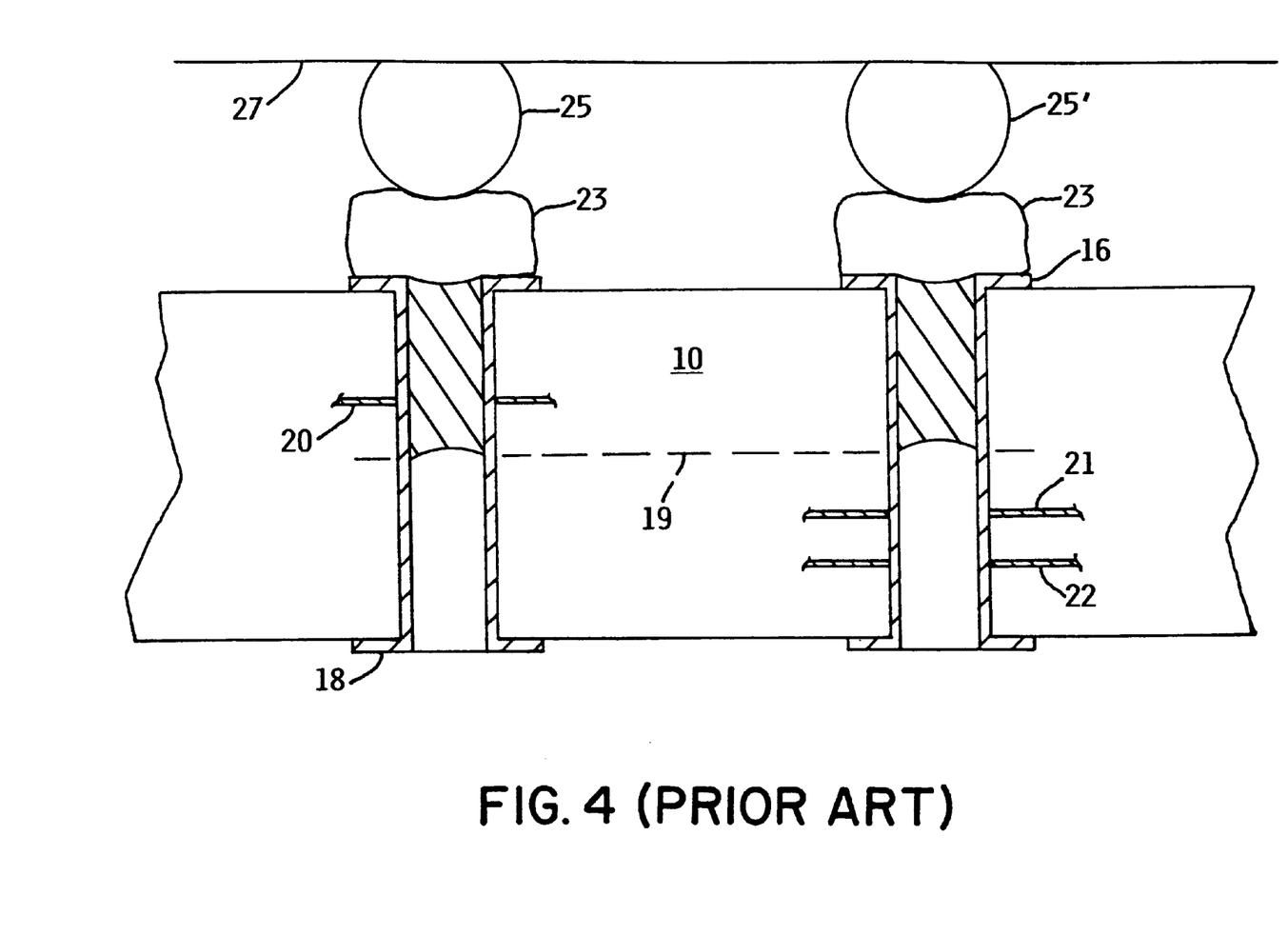
FIG. 4 is the PCB of FIG. 3 subsequent to a second application of eutectic solder paste to the via capture pad contact surfaces with a module to be attached positioned with ball grid connecting surfaces respectively aligned with the PCB via capture pad contact surfaces.
Figure 5:
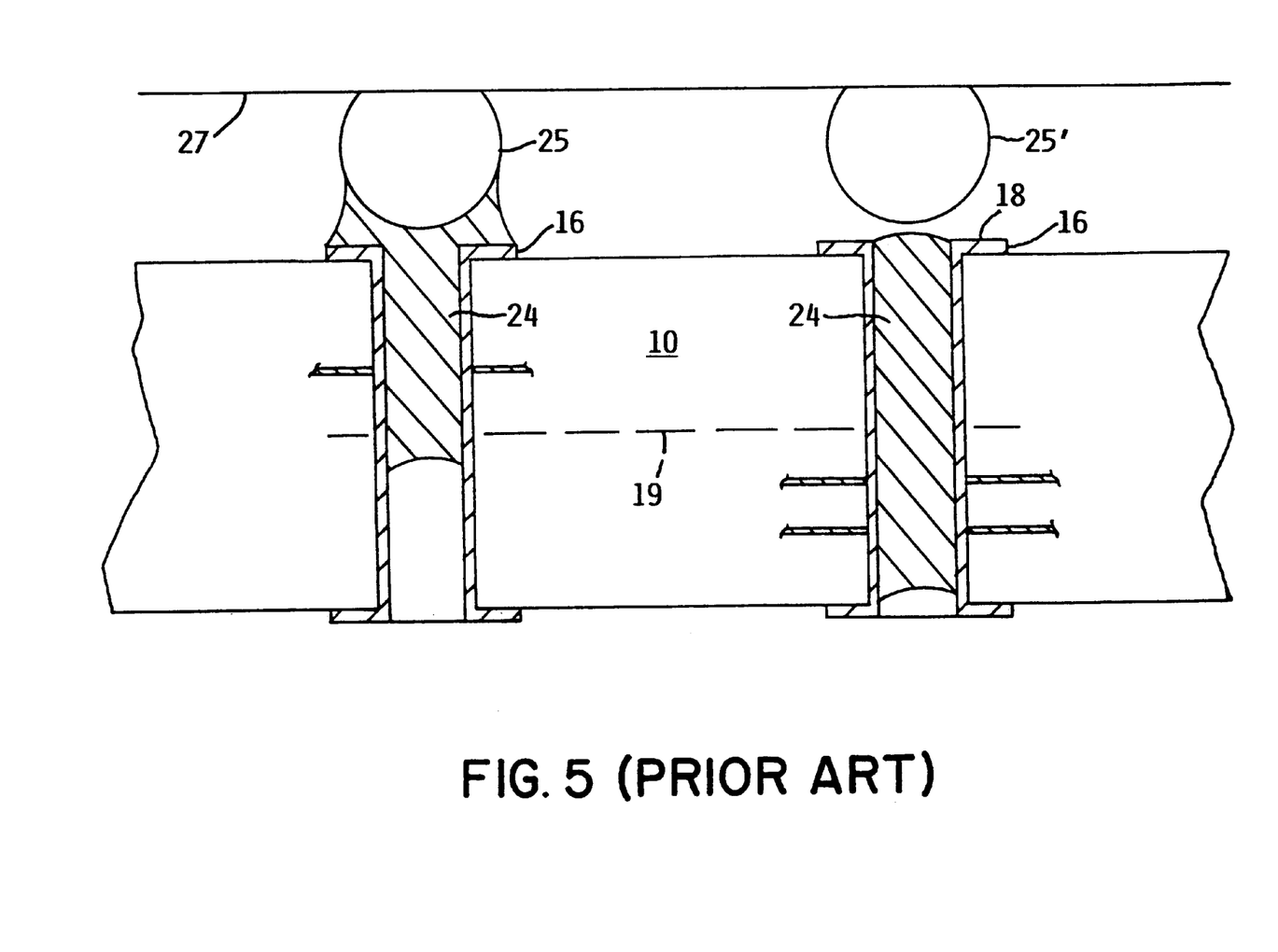
FIG. 5 shows the PCB of FIG. 4 following reflow of the second eutectic solder application.
Figure 6:
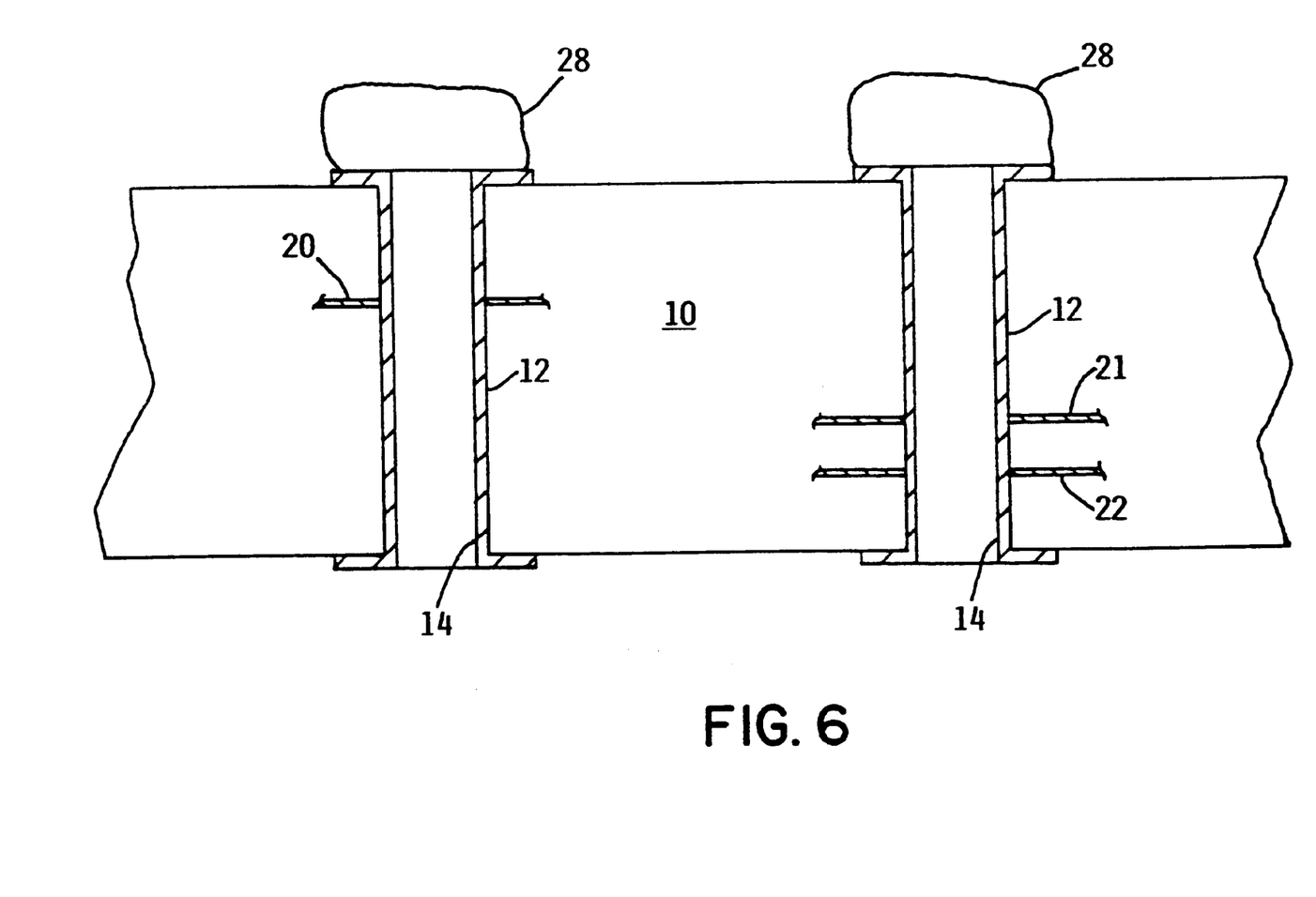
FIG. 6 shows the PCB of FIG. 1 wherein the modified solder paste of the first embodiment of the invention has been applied to the via capture pad contact surfaces.
Figure 7:
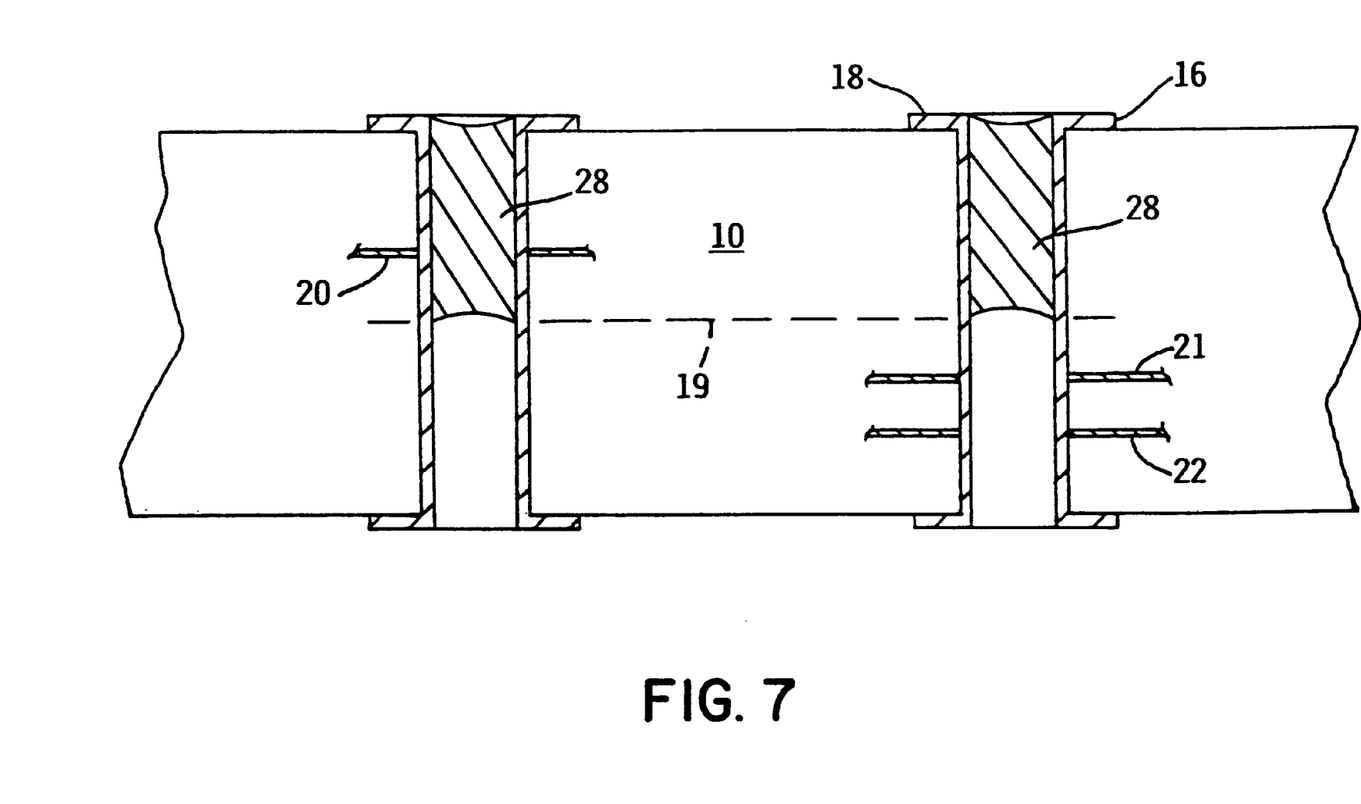
FIG. 7 is the PCB of FIG. 6 with the solder paste reflowed to form a plug in the via that is stable at the reflow temperature of eutectic solder.
Figure 8:
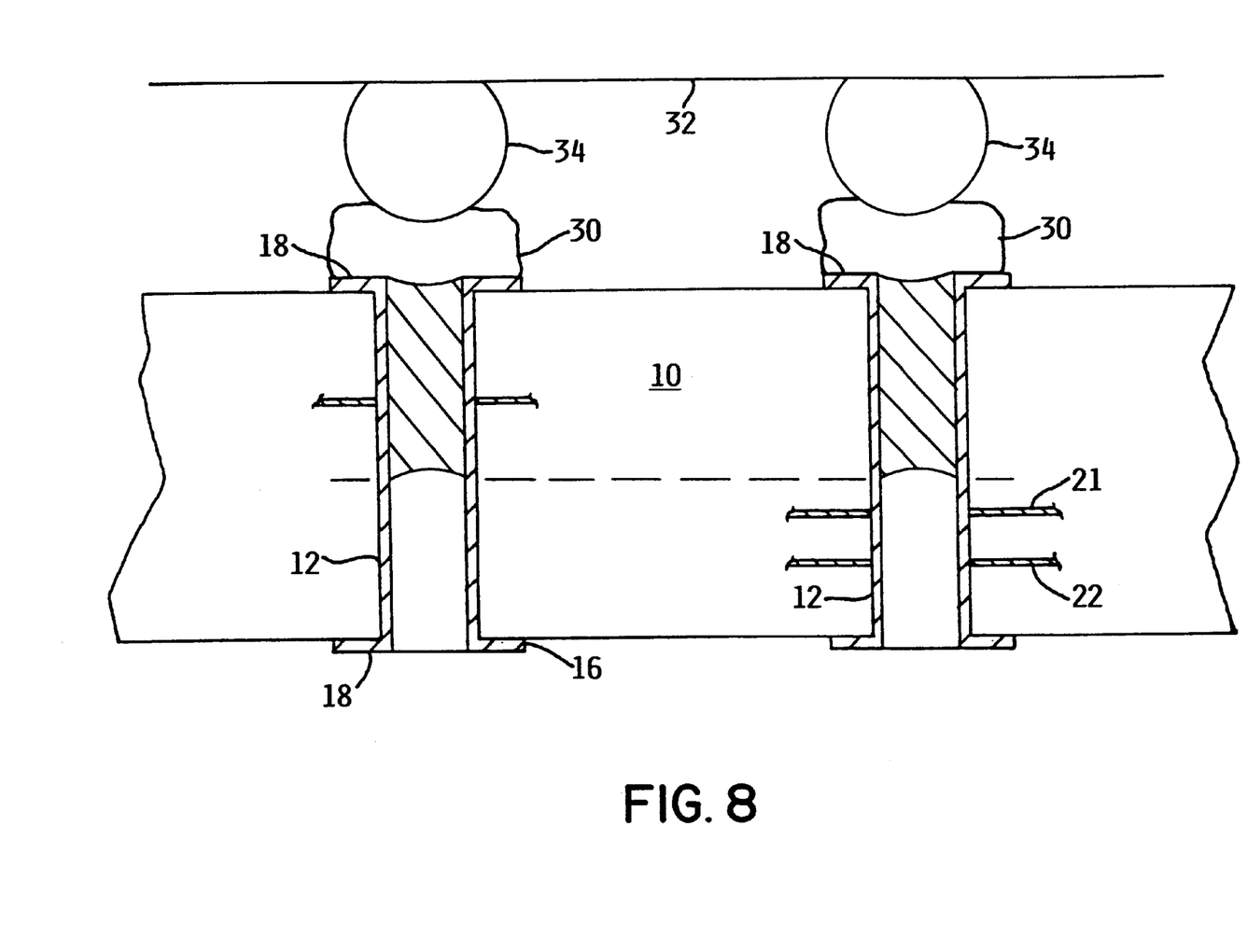
FIG. 8 shows eutectic solder paste applied to the via capture pad contact surfaces of the PCB of FIG. 7 and a module to be attached aligned for connection.

When solder paste 17 is applied to the contact surfaces 18 of via capture pads 16, in preparation for the attachment of a module as shown in FIG. 2, it is recognized that the reflowed solder paste will be carried away from the attachment site by capillary action. As shown in FIG. 3, the reflowed solder paste 17 wets the surface of the via copper barrel 14 and is drawn into the via to a capillary boundary line 19. This initial solder application and reflow attempts to plug the via hole. In current prior art techniques, additional solder paste 23 is applied to the contact surface 18 of the via capture pad 16 to attach a module 27, such as shown in FIG. 4, which presents a ball grid attachment array, including ball contacts 25 and 25'. The resulting attachment may occur as shown in FIG. 5. Upon reflowing the second solder paste application, the total quantity of eutectic solder may not progress significantly beyond the capillary boundary line 19, enabling enough solder to be retained at the via capture pad 16 to complete a sound electrical attachment with the confronting ball 25 of the module ball grid array. However, when the solder paste is heated and possesses the same melting temperature as the previously applied solder, the combined mass of eutectic solder 24, resulting from the combined applications 17 and 23, is likely to become liquid and move far past the prior capillary boundary line 19. The capillary action can remove a sufficient quantity of solder from the contact surface 18 such that an electrical connection with the confronting ball connector is not achieved. Such an open connection is shown in FIG. 5, where the solder mass 24 of the combined solder paste applications 17 and 23 is wicked away from the via capture pad surface 18 and no electrical contact or connection with ball 25' is established. As shown, even multiple successive applications of eutectic solder are no assurance that reliable, consistent solder connections can be achieved. Thus, processes which eliminate potential significant wicking of solder attach material into the via holes of the "via-in-pad" design must be provided to avoid solder joint inconsistency.

The present invention is directed to methods and resulting packaging structures that enable via-in-pad soldering techniques wherein solder is retained on the via pad to effect reliable and repeatable electrical connections while not encountering and overcoming solder wicking into the attach pad vias. A first embodiment involves the use of solder application and reflow methods which effectively plug vias with metal prior to actual solder attach operations. The second embodiment involves use and application of a plating sequence to provide a coating of metal within the via barrel that acts as a wetting barrier to the attach solder, effectively eliminating the solder wicking into the pad vias during module assembly.

To implement the first embodiment, two formulations may be used to provide a via-on-pad assembly packaging structure. One formulation uses a 63/37 weight percent tin/lead (Sn/Pb) solder paste containing a 3 to 5 weight percent addition of palladium (Pd) particles, 1 to 5 microns in size. After application of the paste and reflow between approximately 183–210 degrees centigrade, via-in-pad plugs are formed upon solidification. During reflow, the Pd particulate addition undergoes simultaneous dissolution and reaction with the bulk Sn/Pb alloy paste constituent to form a multicomponent, multiphase alloy. The resultant multiphase alloy consists of Pb-rich, Sn-rich and one or more Sn-Pd intermetallic phases and has an effective melting point range spanning 180 degrees centigrade to greater than 230 degrees centigrade. Since the liquidus temperature of the resultant alloy is in excess of that required for final module assembly to the PCB, the resultant melting point hierarchy introduced into the via plug inhibits movement or wicking of the slushy state of the solder alloy plug material during the module assembly. Thus, a plug is formed in the via hole that is stable when subjected to the reflow temperature of eutectic Sn/Pb solder. Another via plug solder formulation that can be used is a binary tin-silver (Sn/Ag) alloy paste with a composition of 96.5 weight percent Sn/3.5 weight percent Ag. This alloy is the eutectic composition and has an invariant melting temperature of 221 degrees centigrade. This solder would take the process one step further in that the melting point for the Sn/Ag is above the temperature the solder joints for ordinary solder reflow would achieve, (ie. 200–220 degrees centigrade, and typically a 205–210 degree centigrade peak reflow temperature). Other Sn or Pb based solders possessing a similar melting point hierarchy and process temperature compatibility with conventional PCB materials are also candidate materials.

The process for a pad-on-via structure using Sn/Pb/Pd solder is:

---

1. Screen Sn/Pb eutectic solder paste with incorporated Pd particles onto the vias.

-continued

2. Reflow with a normal reflow thermal profile, ie. maximum temperature is 200–220 degrees centigrade. Multicomponent, Pd bearing phases are achieved by diffusion.
3. Clean flux, as required.
4. Screen normal eutectic Sn/Pb solder paste for component placement.
5. Place components.
6. Reflow eutectic solder.
7. Clean flux, as required.
8. If process is double sided, repeat steps one through seven.

The process using Sn/Ag solder would vary the reflow temperature required to melt the Sn/Ag solder:

1. Screen 96.5/3.5 Sn/Ag solder paste onto the vias.
2. Reflow with thermal profile optimized for 245 degree Centigrade max temperature.
3. Clean flux, as required.
4. Screen normal eutectic Sn/Pb solder paste for component placement.
5. Place components.
6. Reflow eutectic solder.
7. Clean flux, as required.
8. If process is double sided, repeat steps one through seven.

FIGS. 6 through 9 illustrate the use of the first embodiment of the invention. The PCB 10 has via holes 12 which are copper plated to form the barrel which contacts selected lands 20, 21, 22 on intermediate PCB layer surfaces and via capture pads 16 which are an extension of the plated via barrel 14 and form via-in-pad contact surfaces 18. The eutectic solder paste 28, containing metal particles capable of forming intermetallic phases, is applied to the via capture pad contact surface 18 (FIG. 6) and reflowed to establish the extended melting point range and form a stable barrier plug (FIG. 7) that closes the via hole opening 12 at the pad surface 18 and is stable at the melting temperature of Sn/Pb eutectic solder. With the opening to the via hole sealed off by the modified solder possessing a higher melting point, a normal eutectic Sn/Pb solder paste 30 is applied (FIG. 8) and the module 32 is positioned with the balls 34 of the ball grid array aligned and contacting the applications of solder paste 30.

Figure 9:
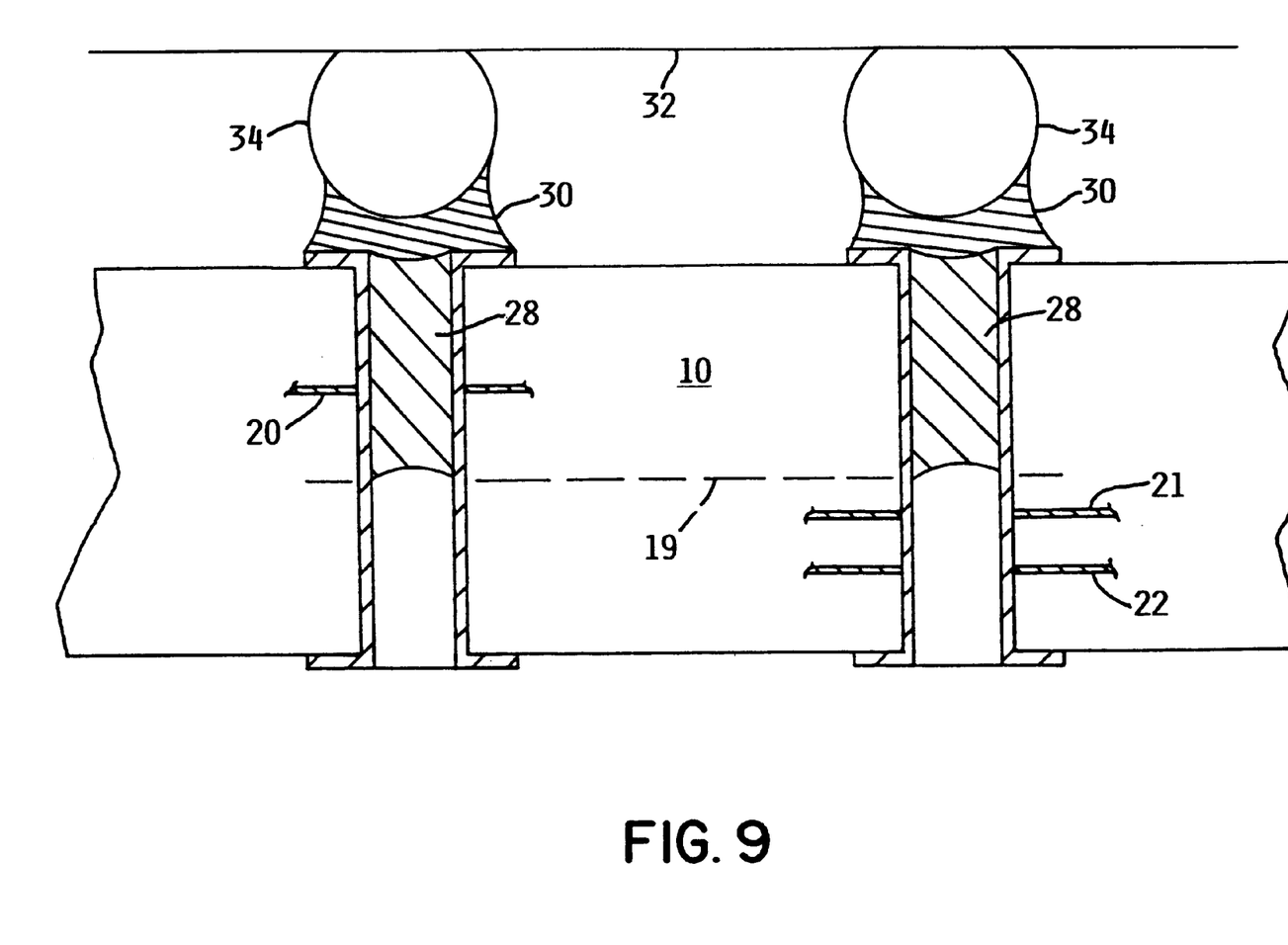
FIG. 9 illustrates the PCB and module of FIG. 8 with the eutectic solder reflowed to complete the electrical connections.

With the via plugged with a modified solder material having a melting point above that of the eutectic solder 30, the eutectic solder paste may be reflowed to establish the electrical connections illustrated in FIG. 9. The higher melting temperature of the first solder application 28 provides a stable plug that does not move or wick away from the contact surfaces 18 when subjected to the melting temperature of eutectic solder. The second solder application 30 of eutectic solder is reflowed at its normal melting temperature and being confined to the via capture pad surface 18, is available to form uniform, reliable and repeatable bonds with the confronting ball grid array ball contact surfaces.

When the Sn/Ag solder paste is used as the initial application, such higher melting point solder composition is reflowed to form the barrier plug 28 which seals the via hole opening at the pad surface 18. Thereafter, the normal eutectic Sn/Pb solder paste 30 is applied and the module 32 or other component placed to effect connection by reflowing the normal Sn/Pb eutectic solder.

The second embodiment, which eliminates need for solder paste printing reflow and cleaning steps to plug vias, involves use of a PCB plating step that provides a coating of plated metal within the via-on-pad barrels that acts as a wetting barrier to solder, even in the presence of fairly aggressive assembly fluxes. The preferred material which possess these attributes is nickel (Ni) which is both inexpensive and readily available at most commercial PCB fabrication facilities. Two potential plating configurations and process flows could be used to provide both barrel barrier metal and other plated features if desired. Both configurations use commercially established processes for masking and plating methods to achieve the desired via structure. In one scenario, the Ni application sequence could involve selective plating and use of plating masks, to apply Ni only in the via-in-pad barrels. In another, the sequence could use the card solder mask to act as an initial mask for plating of Ni, followed by use and application of a plating mask to allow for overplating of any surface or via features which require subsequent solderability or contact robustness. In both scenarios, it is possible to use either electroless or electrolytic plating processes, or a combination of electrolytic platings. Use of photoimagable and/or adhesive masks for additional cost reduction is possible. Moreover, because only very thin platings of Ni are required to effectively "poison" surface solderability from Ni oxide formation, added process costs for both plating and card throughput are minimized.

Figure 10:
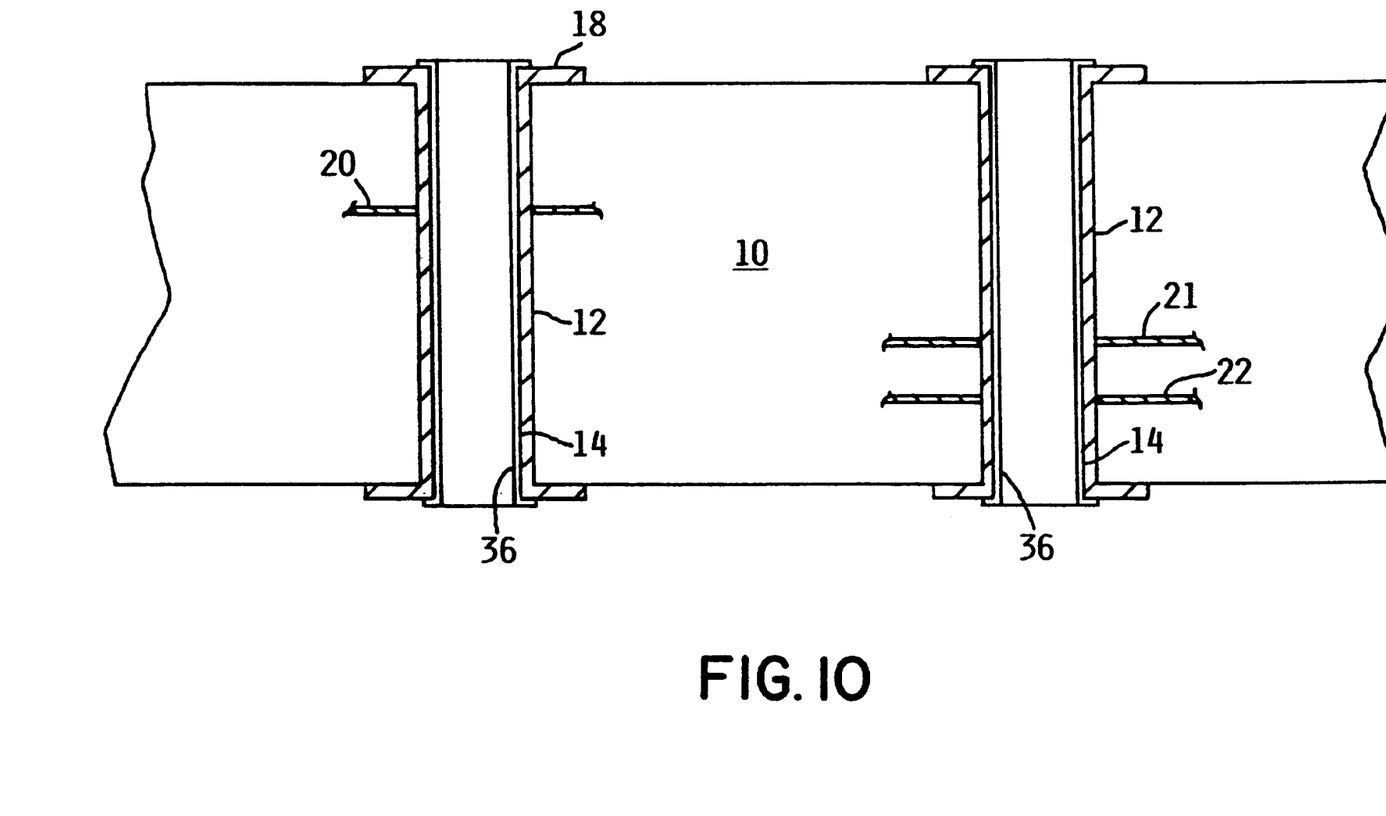
FIG. 10 illustrates a second embodiment of the invention where a coating of metal that is not wetted by solder is applied to the barrel surfaces of the vias in the PCB of FIG. 1.
Figure 11:
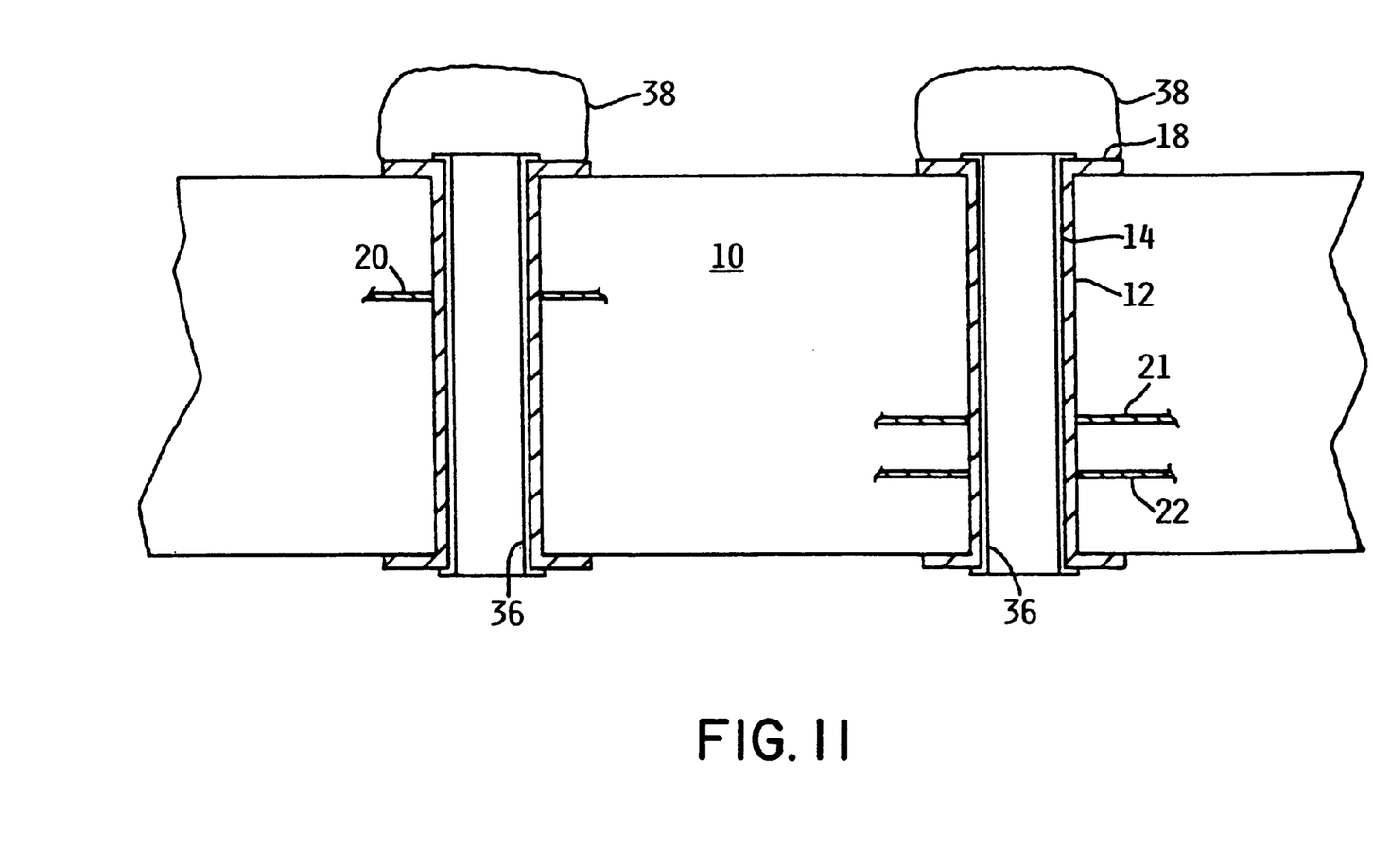
FIG. 11 shows a eutectic Sn/Pb solder paste applied to the via capture pad contact surfaces of the PCB of FIG. 10.
Figure 12:
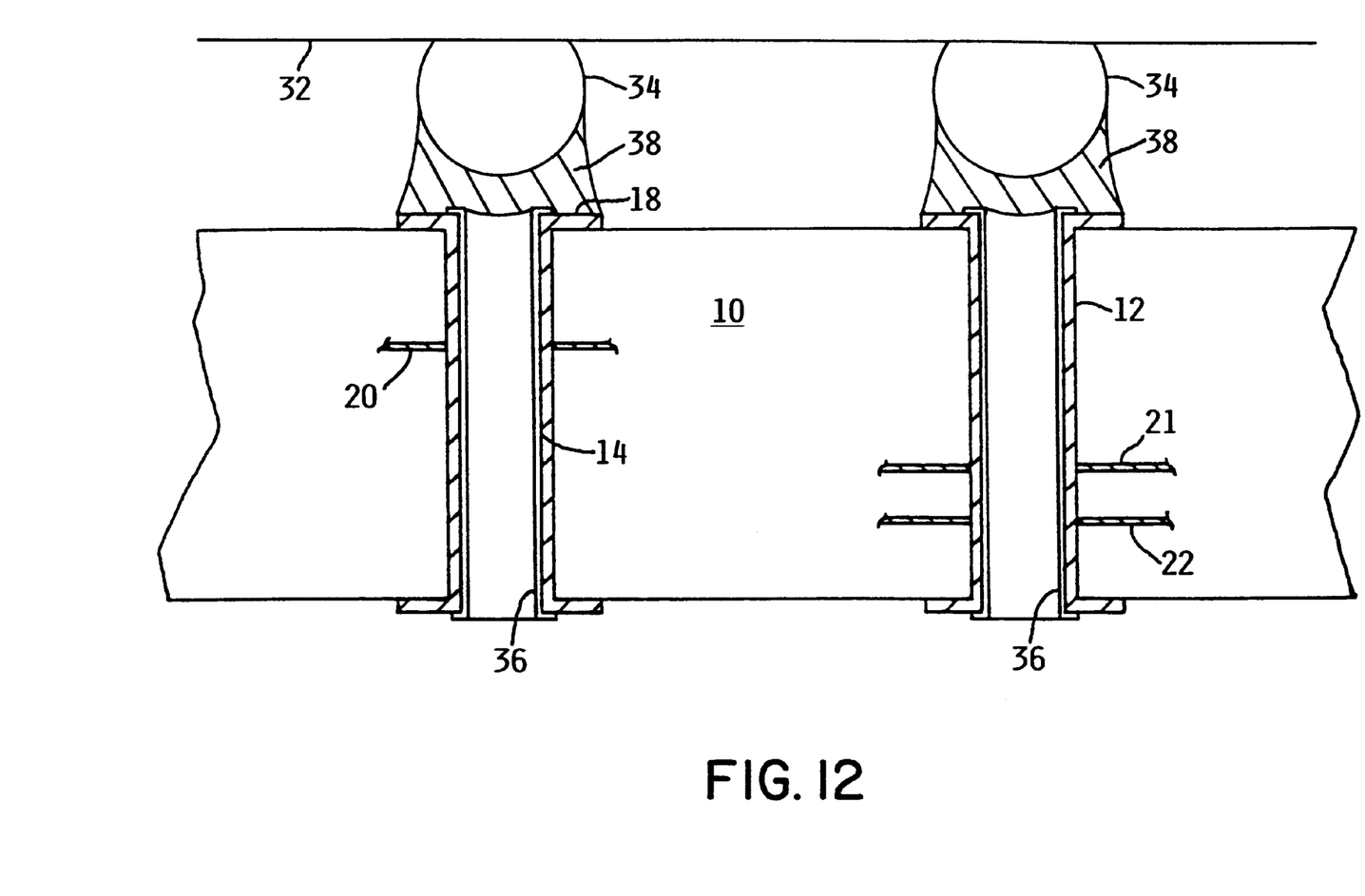
FIG. 12 shows a module having a ball grid array attached to the PCB of FIG. 11 by reflowing the solder paste applied to the via capture pads.

FIG. 10 shows the plated via holes 12 of FIG. 1 which have been further processed to include a plated layer 36 of Ni along the surface of barrel 14 within the via hole 12 in PCB 10. In FIG. 11, eutectic Sn/Pb solder paste 38 is added to the via capture pads, followed by module placement and attach, as shown in FIG. 12. As shown, a grid of solder balls 34, attached to the module 32, are soldered to respective via capture pad contact surfaces by the reflowed solder paste 38 applied to the capture pad surfaces 18. Because the reflowed paste 38 does not readily wet onto the Ni plating, plated barrier 36 prevents capillary or wicking action of the reflowed solder paste 38 into the via hole 12, causing the eutectic Sn/Pb solder to be retained at contact surface 18 to interconnect the module balls 34 to the via capture pads during initial reflow of the solder paste 38 and enabling the formation of reliable and uniformly repeatable solder connections.

While the invention has been particularly shown and described with reference to preferred embodiments thereof, it will be understood by those skilled in the art that various other changes in the form and details may be made therein without departing from the spirit and scope of the invention.

What is claimed is:

1. A process for establishing an electrical attachment between a module having contact surfaces and a printed circuit board (PCB) having plated via holes therethrough which are aligned with said module contact surfaces and present via capture pads with contact surfaces at the confronting board surface surrounding and extending from the via hole plating comprising applying a first solder paste at the via capture pad contact surfaces, said first solder paste comprising an Sn/Pb alloy and particles of a third metal that forms at least one intermetallic phase which increases the upper end of the melting point temperature range of the solder paste mixture when reflowed;

reflowing said first solder paste, whereupon the liquid solder to be wicked into the associated via hole is caused to form said at least one intermetallic phase and create a stable plug at the melting temperature of eutectic Sn/Pb solder;

applying a second solder paste of Sn/Pb solder to said capture pad contact surfaces;

engaging said module contact surfaces with said second solder paste applications at said via capture pad contact surfaces; and reflowing said second solder paste to bond said solder mixture with said contact surfaces to bond and electrically connect said module to said PCB.

2. The process of claim 1, wherein the step of applying a first solder paste comprises applying a Sn/Pb solder paste including particles of a third metal selected from the group consisting of palladium and silver.

3. The process of claim 2, wherein said second solder paste is an eutectic Sn/Pb solder.

4. A process for making an electrical attachment between a module having contact surfaces and a circuit board having plated via holes therethrough which are aligned with said module contact surfaces and present plated via capture pad contact surfaces at the confronting board surface surrounding and extending from said plated via hole comprising applying a first solder paste at said via capture pad surfaces which has melting point higher than the melting point of Sn/Pb solder;

reflowing said first solder paste to form a plug in said via hole that is stable at the melting temperature of Sn/Pb solder;

applying a second solder paste of Sn/Pb solder to said via capture pad contact surfaces;

engaging the module contact surfaces with said second solder paste on said via capture pad contact surfaces; and reflowing said Sn/Pb solder at the contact surface locations to bond and electrically connect said module contact surfaces respectively to said via capture pads.

5. The process of claim 4, wherein said first solder paste is Sn/Ag solder paste.

6. The process of claim 5, wherein the step of applying a second solder paste comprises applying Sn/Pb eutectic solder.

7. The process of claim 4, wherein the resultant liquidus temperature of said first solder paste, after initial reflow, exceeds the melting point of eutectic Sn/Pb solder by more than 15 degrees centigrade.

* * * * *